United States Patent
Patel

(10) Patent No.: US 8,000,106 B1
(45) Date of Patent: Aug. 16, 2011

(54) CIRCUIT DISTRIBUTION TO MULTIPLE INTEGRATED CIRCUITS

(75) Inventor: Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 284 days.

(21) Appl. No.: 11/969,373

(22) Filed: Jan. 4, 2008

Related U.S. Application Data

(60) Provisional application No. 60/878,911, filed on Jan. 5, 2007.

(51) Int. Cl.
*H05K 7/00* (2006.01)

(52) U.S. Cl. .......................................... 361/760; 361/790

(58) Field of Classification Search .................. 361/760, 361/695, 790; 174/254, 260–262; 257/208, 257/211
See application file for complete search history.

(56) References Cited

U.S. PATENT DOCUMENTS

| | | | | |
|---|---|---|---|---|
| 4,582,975 A | * | 4/1986 | Daughton | 219/209 |
| 5,455,445 A | * | 10/1995 | Kurtz et al. | 257/419 |
| 2005/0205970 A1 | * | 9/2005 | Chen et al. | 257/666 |
| 2008/0122075 A1 | * | 5/2008 | Bauer et al. | 257/724 |
| 2008/0212355 A1 | * | 9/2008 | Khanuja et al. | 365/94 |
| 2009/0145631 A1 | * | 6/2009 | Gabara | 174/254 |

* cited by examiner

*Primary Examiner* — Yuriy Semenenko

(74) *Attorney, Agent, or Firm* — Ward & Zinna, LLC

(57) ABSTRACT

A semiconductor system in a package separates those circuits in a field programmable gate array (FPGA) into two substrates. In particular, the logic elements are formed in a first semiconductor substrate and certain non-logic elements are formed in a second semiconductor substrate that is in mechanical and electrical connection with the first substrate. The two substrates are enclosed in a suitable protective package and electrical connections are provided between one or both substrates and the exterior. The non-logic elements formed in the second substrate are located in circuits that would have a signal propagation delay in a conventional FPGA that is more than approximately twice the interconnect delay between the two substrates.

12 Claims, 5 Drawing Sheets

CIRCUIT DISTRIBUTION TO MULTIPLE INTEGRATED CIRCUITS

CROSS-REFERENCE TO RELATED APPLICATION

This application claims the benefit of provisional application No. 60/878,911, filed Jan. 5, 2007 which is hereby incorporated by reference in its entirety.

BACKGROUND

The present invention relates generally to an electronic package and a method for making it and, in particular, to an electronic package in which multiple integrated circuits are stacked one above another. A particular application for this package is in the implementation of field programmable gate arrays (FPGA) and the invention will be described in that context.

BACKGROUND OF THE INVENTION

A FPGA is a programmable logic device containing a large number of small programmable logic elements, a number of input/output (I/O) terminals, and a method of specifying electrical connections between the logic elements through a distributed array of programmable switches. The programming of the logic elements and the switches is typically specified by configuration bits stored in a configuration random access memory (CRAM). A FPGA allows a design engineer to realize a design of a product by programming its connections in a specific manner without incurring the high cost of manufacturing a unique integrated circuit. A variety of FPGAs are described in S. D. Brown, R. J. Francis, J. Rose, and Z. G. Vranesic, *Field-Programmable Gate Arrays*, (Kluwer Academic Publishers 1992); J. H. Jenkins, *Designing with FPGAs and CPLDs*, (PTR Prentice-Hall 1994); J. V. Oldfield and R. C. Dorf, *Field Programmable Gate Arrays*, (Wiley-Interscience 1995).

FIGS. 1 and 2 illustrate the general layout of certain FPGAs supplied by Altera Corporation, the assignee of the present application. FIG. 1 depicts a programmable logic device 20 comprising logic array blocks (LAB) 22. Device 20 is implemented as a single integrated circuit. Each logic array block 22 comprises a group of logic elements (LE) 24 which is frequently referred to as core logic. Around the periphery of the programmable logic device 20 are input/output elements (IOE) 26. Each logic element 24 and input/output element 26 can generate one or more signals that can be routed to other logic elements 24 or input/output elements 26 through vertical (or column) interconnect circuitry 28 and horizontal (or row) interconnect circuitry 30. The interconnect circuitry (or bus) is located in one or more metallization layers of the integrated circuit. As shown in FIG. 1, the vertical and horizontal interconnect circuitry 28, 30 extends across the full width of the integrated circuit in that direction. The interconnection circuits that extend the full width of the integrated circuit are often referred to as global circuits. The number of LABs 22 shown in programmable logic device 20 of FIG. 1 is only illustrative. In practice, logic device 20 could have fewer LABS and often has more.

FIG. 2 is a more detailed view of a logic array block (LAB) 22. LAB 22 a set of logic elements (LE1-LE8). Local interconnect circuitry 31 routes signals generated within the LAB 22 (or signals generated externally to LAB 22 which have been routed to this LAB) to the logic elements 24 within that LAB. Multiplexers 32 provide for various connections between LAB 22 and the vertical and horizontal circuitry 28, 30. Various programmable switches (not shown), which may include multiplexers, provide a variety of interconnections among the logic elements.

In addition to the logic elements 24, input/output elements 26, interconnect circuitry 28, 30, local interconnect circuitry 31, and multiplexers 32, a FPGA typically includes configuration memory (CRAM), a control block, at least one digital signal processor (DSP), a clock, and at least one phase lock loop (PLL). Other circuits may also be incorporated into the FPGA. As will be appreciated, while many of these circuits are digital circuits, some of them such as the PLL are analog circuits. FIG. 3 is a floor plan depicting an illustrative layout of logic elements (or core logic) 324 and other circuitry 340 in an FPGA integrated circuit relative to vertical and horizontal interconnect circuitry 328, 330. As shown in the layout of FIG. 3, logic elements 324 take up approximately 50% of the total area of the integrated circuit; and all the other circuits such as I/O elements, interconnect circuitry, multiplexers, CRAM, control blocks, DSP, PLL, clock, etc. (i.e., the non-logic elements) 340 take up the remaining 50% of the area. This allocation of area is typical in state-of-the-art FPGA integrated circuits.

Like all integrated circuits, the minimum feature size of the individual circuits in a FPGA has been steadily reduced since the first FPGAs were introduced approximately 20 years ago; and, as a result, more and more individual circuits have been formed in the same area of a FPGA. In recent years, however, it has become more and more difficult to achieve desired reductions in minimum feature size in FPGAs for a variety of reasons. Some of these difficulties relate to increased signal delay and parasitics in conductors. It has been observed that such delays and parasitics increase as the width of the conductor decreases. At a technology node such as the 45 nanometer (nm.) node, such delays and parasitics can become unacceptable even in copper conductors when such conductors have the length of the global horizontal or vertical interconnect circuitry used in a conventional FPGA integrated circuit.

SUMMARY

I have devised a semiconductor system in a package that separates the circuits of a device, such as an FPGA, that otherwise would be implemented on a single integrated circuit chip into at least two chips that are stacked one on top of the other. In one embodiment, the logic elements of an FPGA are formed on a first semiconductor substrate and the other circuits of the FPGA are formed on either the first substrate or a second semiconductor substrate that is in mechanical and electrical connection with the first substrate. As a result, the size of each of the substrates can be reduced relative to the size of a conventional FPGA, thereby reducing the length of the global horizontal and vertical buses that traverse the substrate and reducing delays and parasitics.

The location of the non-logic elements on either the first or second semiconductor substrate is determined by the amount of delay encountered by the circuit in which the non-logic element is located. If the amount of delay encountered by such circuit in a conventional FPGA integrated circuit would be more than the circuit delay encountered if the non-logic element were in the second substrate, then the non-logic element is located in the second substrate. Otherwise, the non-logic element is located in the first substrate with the logic elements. The two substrates are enclosed in a suitable protective package and electrical connections are provided between one or both substrates and the exterior.

It must be emphasized that these ideas may be practiced with any type of non-logic element. By way of example but not limitation, in the case of an FPGA, the non-logic element can be I/O elements, interconnect circuitry, multiplexers, configuration memory or a DSP core.

These ideas may also be extended to systems in packages having more than two semiconductor substrates and these ideas may be practiced at any process node.

In addition to the performance benefits achievable with the invention, it should also be possible to reduce the number of layers of metallization on the first semiconductor substrate containing the logic elements. It should also be possible to increase the density of logic elements in the first semiconductor substrate with minimum or zero penalty on performance.

BRIEF DESCRIPTION OF THE DRAWINGS

These and other objects, features and advantages of the present invention will be more readily apparent from the following Detailed Description in which.

DETAILED DESCRIPTION

Figure 1:
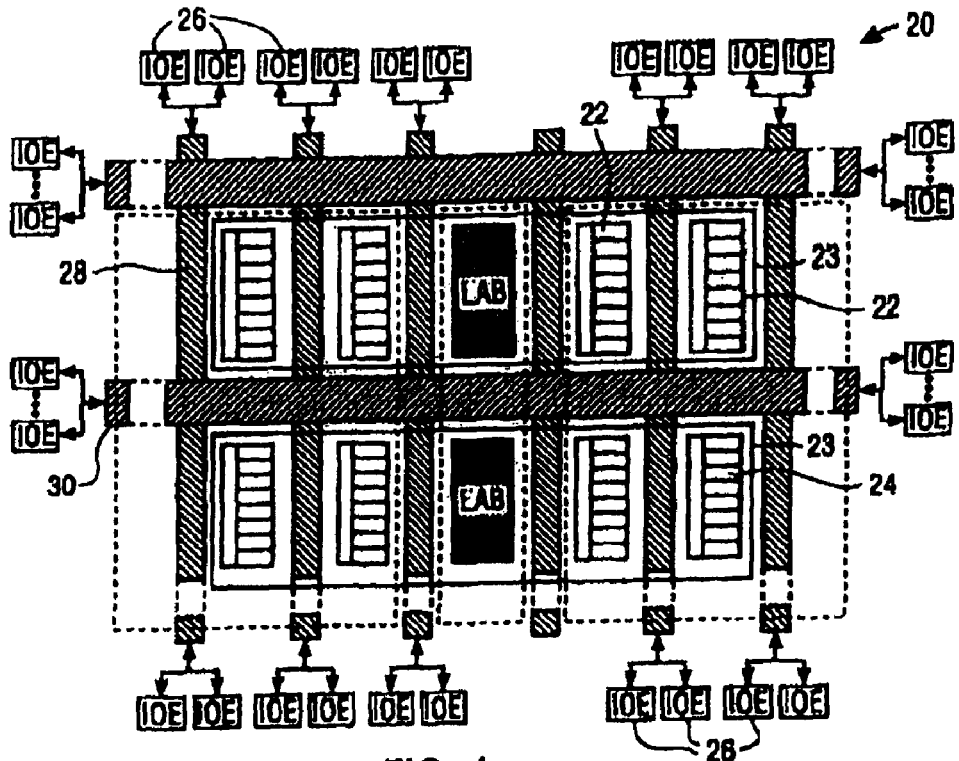
FIG. 1 is a schematic representation of a prior art FPGA.
Figure 2:
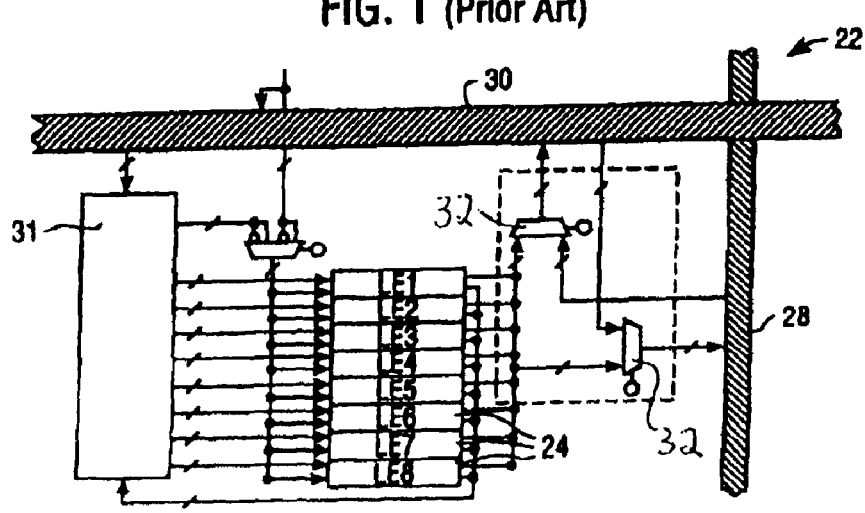
FIG. 2 is a schematic representation of a portion of the FPGA of FIG. 1.
Figure 3:
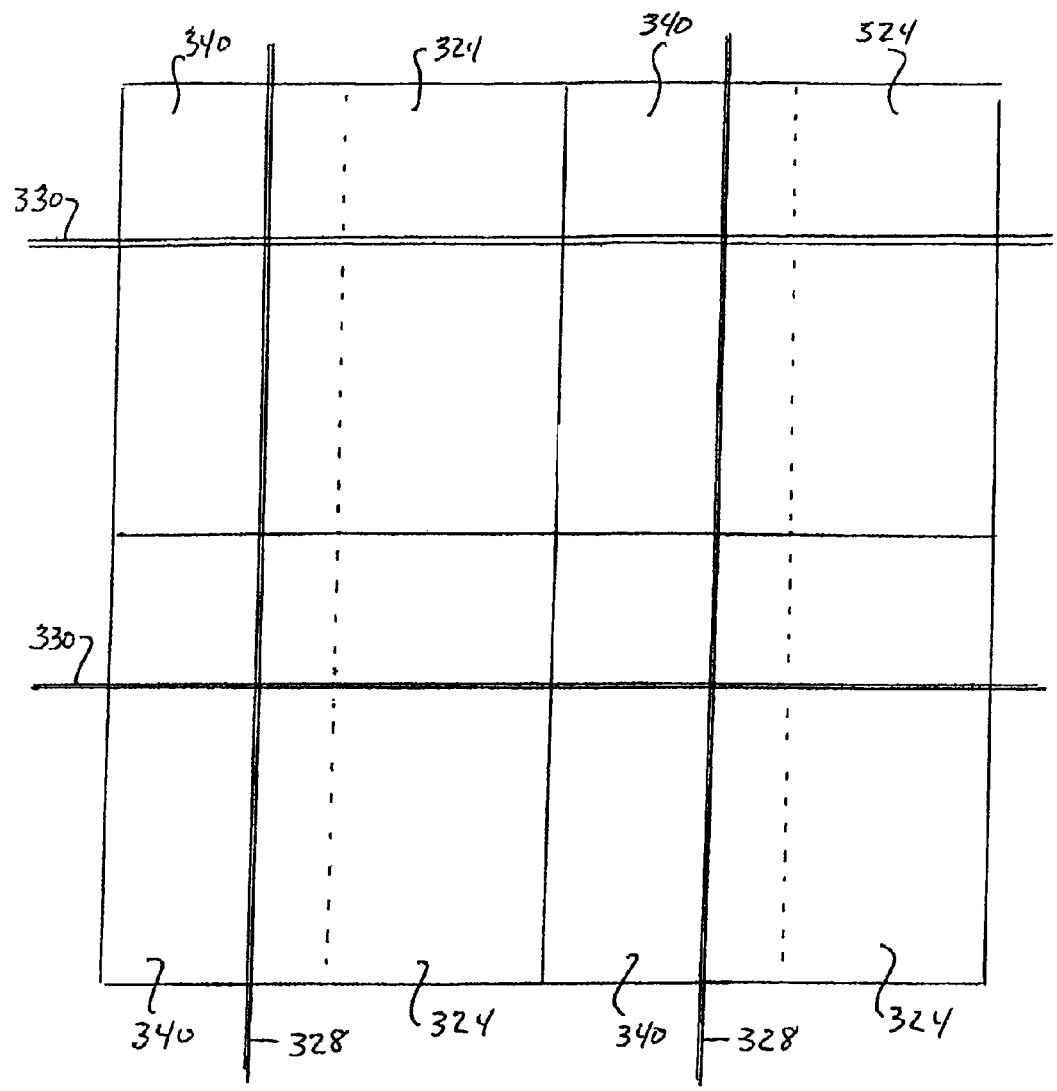
FIG. 3 is a representation of the floor plan of a prior art FPGA.
Figure 4:
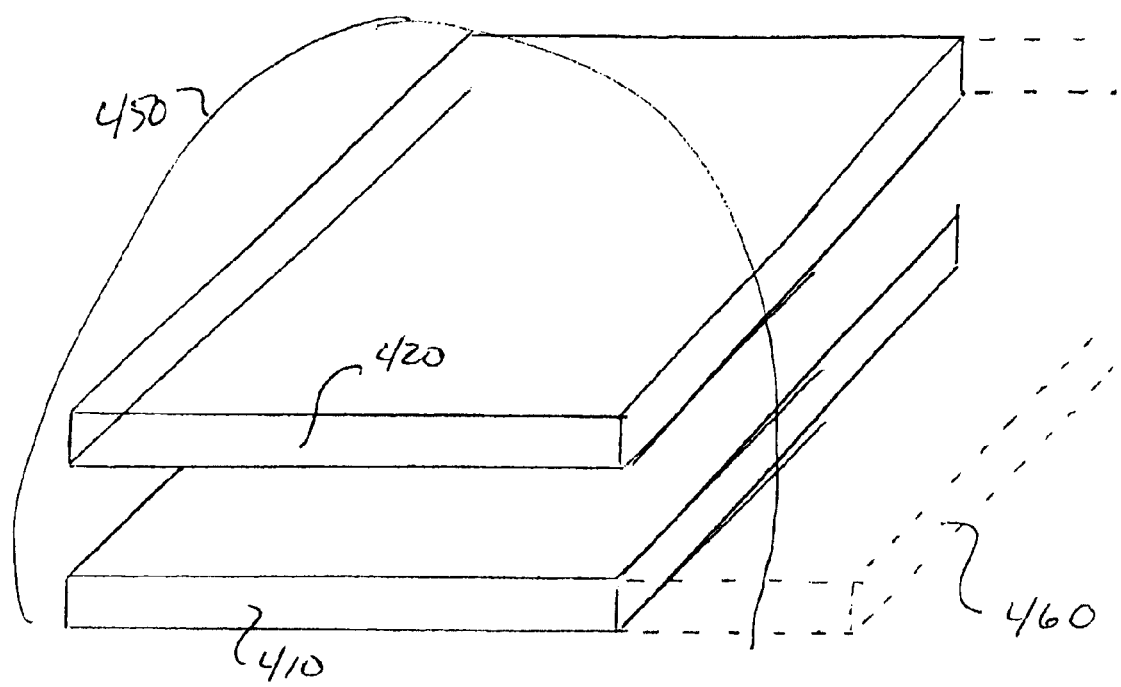
FIG. 4 is a representation of an illustrative FPGA of the present invention.

FIG. 4 depicts a system in a package in a first embodiment of the invention. System 400 comprises a first semiconductor substrate 410 and a second semiconductor substrate 420 that are stacked on one another. Substrates 410 and 420 are mechanically and electrically connected together by an array of solder balls or solder bumps (not shown). Substrate 410 is connected by solder bumps, wire bonds (not shown) or equivalent to the individual leads of a conventional lead frame (not shown). A conventional package 450 encloses substrates 410, 420, solder bumps and wire bonds.

Also shown in FIG. 4 for comparison purposes is the outline in dashes of a conventional FPGA integrated circuit 460. Assuming that the circuits of the conventional FPGA can be distributed approximately equally between the two substrates, the lateral dimensions of the FPGA can be reduced by almost 30% in each direction.

In accordance with the invention, logic elements are formed on the first semiconductor substrate 410 and certain non-logic elements are formed on the second semiconductor substrate 420. The location of the non-logic elements on either the first semiconductor substrate or the second semiconductor substrate is determined by the amount of delay encountered by the circuit in which the non-logic element is located. If the amount of delay encountered by such circuit when implemented in a conventional FPGA integrated circuit would be more than the circuit delay encountered in the circuit of FIG. 4, then the non-logic element is located on the second semiconductor substrate. Otherwise, the non-logic element is located in the first substrate with the logic elements. As a result of this arrangement, some or all of the I/O elements, the global interconnect circuitry and associated drivers and multiplexers are likely to be relocated to the second substrate or one or more metallization layers associated therewith. Likewise, some or all of the local interconnect circuitry and associated drivers and multiplexers are likely to be relocated to the second substrate. Some or all of the CRAM may also be relocated to the second substrate. Still other elements may be relocated to the second substrate.

Figure 5:
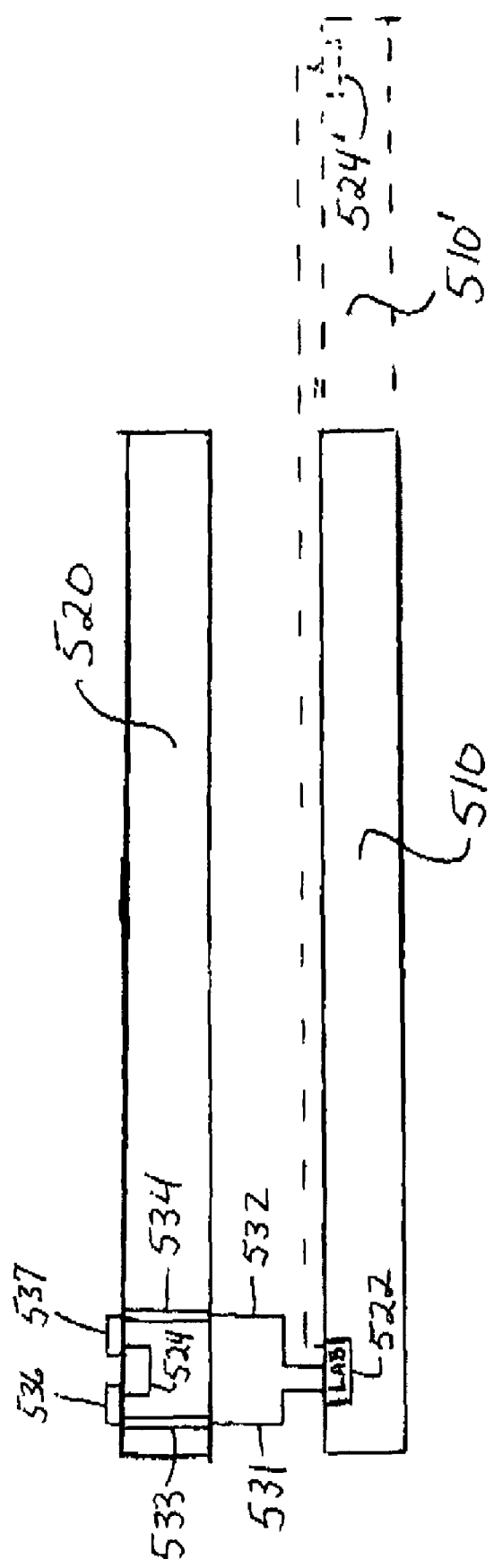
FIG. 5 is a representation of an interconnection in the FPGA of the present invention.

FIG. 5 is a schematic illustration of a circuit 500 that connects a LAB 522 on a first substrate 510 with a non-logic element 524 on a second substrate 520 in accordance with invention. As in the embodiment shown in FIG. 4, each substrate implements approximately half the circuits of the FPGA and has approximately half the surface area of a single substrate implementation of the same FPGA. The connection between LAB 522 and non-logic element 524 is made through conductors 530, 531 which are formed in one or more metallization layers on substrate 510, through silicon-through-vias 533, 534 extending through second substrate 520 and through conductors 536, 537 formed in one or more metallization layers on substrate 520. The distance between vias 533 and 534 has been exaggerated for purposes of readability. In practice, the distance between the vias should be chosen so as to minimize the length of conductors 536, 537 on substrate 520. Likewise, the location of vias 533 and 534 relative to LAB 522 should be such as to minimize the length of conductors 530, 531 on substrate 510.

For comparison purposes, FIG. 5 also depicts in dotted lines the outline of a single substrate 510' that would be needed to implement the two substrate FPGA of FIG. 5. This single substrate is slightly more than 40% greater in length (as shown) and 40% greater in width than substrate 510 or 520. Also shown is a non-logic element 524' that might be found at the end of a global bus on substrate 510'.

The circuit delay encountered in the circuit formed by LAB 522 and non-logic element 524' is approximately proportional to twice the length of single substrate 510'. The circuit delay encountered in the circuit formed by LAB 522 and non-logic element 524 is approximately proportional to the length of conductors 531, 532, 536, 537 and the interconnect delay caused by vias 533, 534. In general, it is advantageous to locate non-logic element 524 in second substrate 520 whenever the circuit delay in the circuit from LAB 522 to element 524 is less than the circuit delay in the circuit from LAB 522 to element 524'. As emphasized above, the length of conductors 531, 532, 536, 537 should be minimized. As a result, an approximate statement of this test and a convenient rule of thumb is: when the delay encountered by a circuit when implemented in a conventional single integrated circuit would be more than approximately twice the interconnect delay caused by one of vias 533, 534 between two integrated circuits, then it is advantageous to implement the circuit on two substrates with the logic element on one substrate and the non-logic element on the second substrate.

Figure 6:
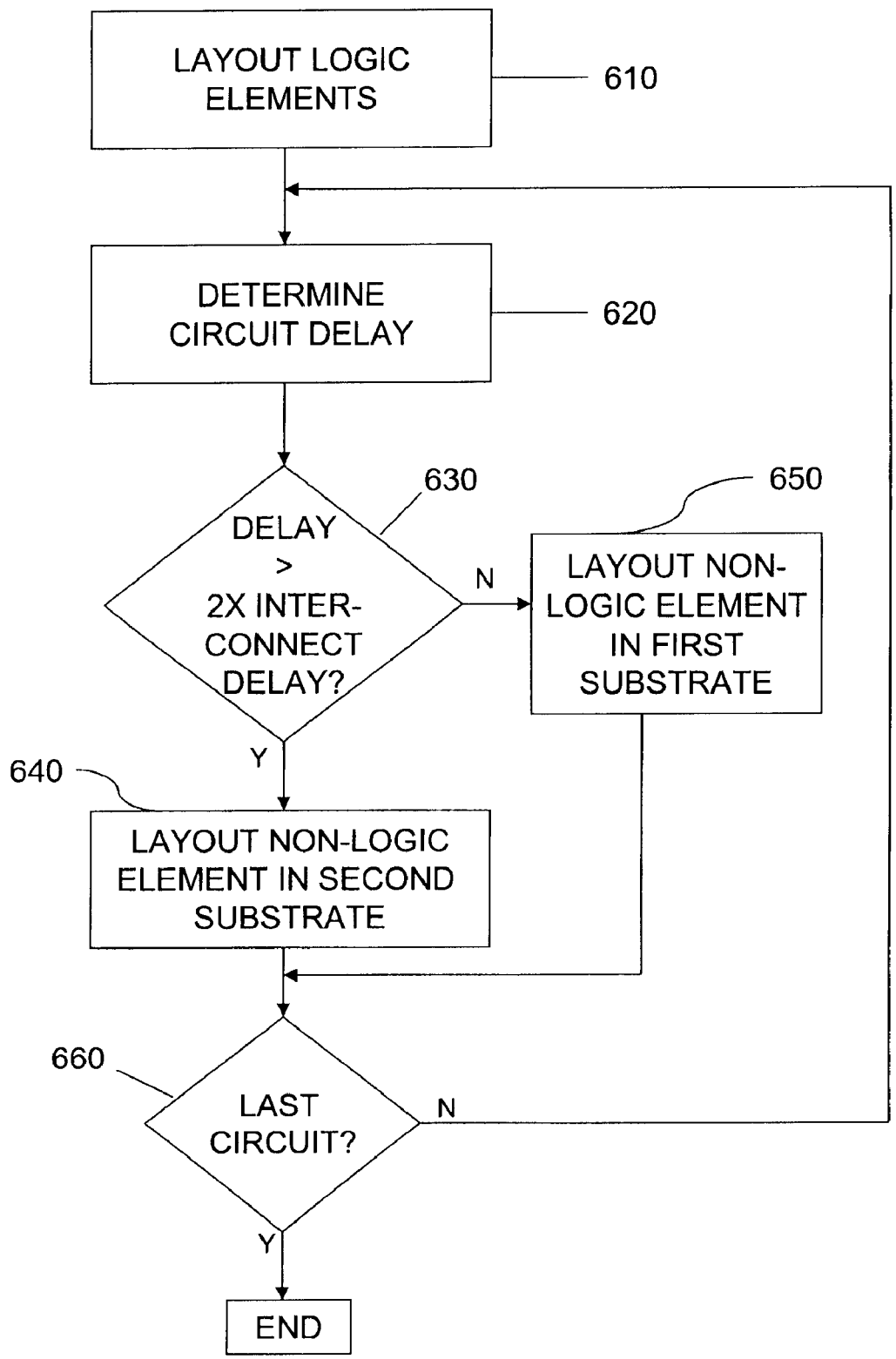
FIG. 6 is a flowchart of an illustrative embodiment of the invention.

FIG. 6 is a flowchart depicting a method of practicing the invention to layout an FPGA in a plurality of semiconductor substrates. At step 610, the logic elements of the FPGA are laid out in the first semiconductor substrate. Then, at step 620, for each circuit in the FPGA in which a non-logic element is located, the amount of delay in the circuit is determined assuming that the FPGA were implemented in a single semiconductor substrate. A test is made at step 630. If the amount of delay so determined is more than approximately twice the interconnect delay encountered between the first and second substrates, the non-logic element is laid out at step 640 in the second semiconductor substrate. On the other hand, if the amount of delay so determined is less than approximately twice the interconnect delay encountered between the first and second substrates, the non-logic element is laid out at step 650 in the first semiconductor substrate. At step 660, a determination is made whether all circuits have been laid out. If so, the process ends. Otherwise, the process returns to step 620 and determines the amount of delay in the next circuit.

As will be apparent to those skilled in the art, numerous variations may be made in the present invention.

What is claimed is:

1. A semiconductor system in a package comprising:
   first and second semiconductor substrates in which circuits are defined, said second substrate being positioned on top of said first substrate and in mechanical and electrical connection therewith,
   one of said substrates including logic elements and the other of said substrates including non-logic elements, the non-logic elements in the other of said substrates being located in a circuit that would have a signal propagation delay more than approximately twice an interconnect delay between the substrates if the circuit were laid out in a single substrate, and
   a package enclosing said first and second substrates.

2. The system of claim 1 wherein the mechanical and electrical connection between the first and second substrates comprises an array of solder bumps or solder balls between the first and second substrates.

3. The system of claim 1 wherein the semiconductor system is a field programmable gate array.

4. The system of claim 3 wherein a global interconnect is formed in one or more metallization layers on one of said substrates.

5. The system of claim 3 wherein the non-logic elements are input/output elements, interconnection circuitry, multiplexers, or configuration memory.

6. The system of claim 1 wherein the first and second semiconductor substrates are interconnected by a plurality of silicon-through-vias.

7. The system of claim 1 wherein the first substrate includes the logic elements, the second substrate includes the non-logic elements and the non-logic elements in the second substrate are connected to the logic elements in the first substrate by silicon-through-vias in the second substrate.

8. A method for laying out a circuit in at least first and second semiconductor substrates that are stacked one on top of the other comprising the steps of:
   laying out logic elements of the circuit in the first semiconductor substrate,
   determining the amount of delay in a subcircuit of the circuit comprising at least one logic element and a non-logic element, if the subcircuit were implemented in a single semiconductor substrate,
   if the amount of delay is more than approximately twice an interconnect delay encountered between the first and second substrates, laying out the non-logic element in the second semiconductor substrate, and
   if the amount of delay is less than approximately twice the interconnect delay encountered between the first and second substrates, laying out the non-logic element in the first semiconductor substrate.

9. The method of claim 8 wherein the interconnect delay is the delay caused by a silicon-through-via in the second semiconductor substrate.

10. The method of claim 8 wherein the circuit is a field programmable gate array.

11. The method of claim 10 wherein the non-logic element is an input/output element, interconnection circuitry, a multiplexer or a configuration memory.

12. A semiconductor system in a package comprising:
   first and second semiconductor substrates in which circuits are defined, said second substrate being mounted on said first substrate and in electrical connection therewith,
   one of said substrates including logic elements and the other of said substrates including non-logic elements, the non-logic elements in the other of said substrates being located in a circuit that would have a signal propagation delay more than approximately twice an interconnect delay between the substrates if the circuit were laid out in a single substrate, and
   a package enclosing said first and second substrates.

\* \* \* \* \*